United States Patent [19]
Vinn et al.

[11] Patent Number: 5,317,281
[45] Date of Patent: May 31, 1994

[54] SLEW RATE BOOSTER CIRCUIT

[75] Inventors: Charles L. Vinn, Mipitas; Yihe Huang, Palo Alto, both of Calif.

[73] Assignee: Raytheon Company, Lexington, Mass.

[21] Appl. No.: 3,361

[22] Filed: Jan. 12, 1993

[51] Int. Cl.$^5$ ............................................. H03F 3/26
[52] U.S. Cl. ....................................... 330/265; 330/85
[58] Field of Search ................. 330/85, 263, 265, 267, 330/268

[56] References Cited

U.S. PATENT DOCUMENTS

3,803,503  4/1974  Greutman ........................ 330/265
4,571,553  2/1986  Yokoyama ..................... 330/85 X
5,179,355  1/1993  Harvey ............................ 330/265

Primary Examiner—Steven Mottola
Attorney, Agent, or Firm—William R. Clark; Richard M. Sharkansky

[57] ABSTRACT

A circuit for increasing the slew rate of linear amplifier circuits. The circuit comprises two NPN and PNP transistor pairs arranged so that when the voltage level difference between the amplifier output and input voltage exceeds the base to emitter voltage of such transistors, the circuit is activated. The circuit provides a current proportional to such voltage difference in order to speed up the charging or discharging of the slew rate determining capacitance.

9 Claims, 5 Drawing Sheets

SLEW RATE BOOSTER CIRCUIT

BACKGROUND OF THE INVENTION

This invention relates generally to linear amplifiers and more specifically to a circuit for increasing the slew rate of such amplifiers.

As is known in the art, linear amplifiers are used in a variety of applications in which an input signal is desired to be amplified. That is, the amplifier circuit amplifies the input signal to provide an output signal proportional to such input signal. Or, in the case of an operational amplifier, the output signal is proportional to the difference between a pair of input signals. Ideally, the voltage level of the output signal changes instantaneously in response to changes in the voltage level of the input signal(s).

As is also known, linear amplifiers have capacitance associated therewith, such as may be internal, parasitic capacitance or capacitance which is externally added for compensation purposes (i.e. for modifying the frequency response of the amplifier to prevent oscillations). Since the voltage across a capacitor cannot change instantaneously, changes in the output signal cannot occur instantaneously in response to changes in input signal(s). The rate of change of the output signal with time is referred to as slew rate and the propagation delay refers to the delay between a change in the input signal and a corresponding change in the output signal. Both the slew rate and the propagation delay are limited by the size of the capacitance associated with the linear amplifier. Specifically, the slew rate is equal to the capacitance charging (or discharging) current divided by the value of the capacitance. The capacitance charging or discharging currents are provided by the amplifier's input, driver, or other stages. When the input signal changes slowly, these stages can charge or discharge the capacitance so that the output signal closely follows the input signal(s). Whereas, when the input signal changes quickly, the capacitor requires a relatively large amount of current for charging or discharging. In this case, the output signal will not change as fast as the input signal(s), thereby resulting in a propagation delay as well as a reduction in the slew rate.

SUMMARY OF THE INVENTION

With the foregoing background in mind, it is an object of the present invention to provide a circuit for increasing the slew rate of a linear amplifier.

Another object is to provide such a circuit for increasing the slew rate of a linear amplifier having two circuit nodes which affect the slew rate.

It is a further object to provide a circuit for reducing the delay between a change in the input signal to a linear amplifier and a change in the output signal thereof.

These and other objects are attained generally by providing a circuit for increasing the slew rate of an amplifier comprising means for comparing an input signal of the amplifier and an output signal of the amplifier to determine the difference in the voltage level of the signals and means for supplying a current to the amplifier. The current is supplied in response to the difference in the voltage levels of the input signal and the output signal being above a predetermined value.

With this arrangement, a slew rate enhancing circuit is provided that operates only when the difference in voltage level between the input signal and the output signal is greater than the predetermined value. Here, the predetermined value is the base to emitter voltage drop of a bipolar transistor. That is, the circuit operates to supply a current to the amplifier to charge or discharge the capacitance associated therewith which affects the slew rate. Furthermore, such current is supplied only when the output signal unsatisfactorily tracks the input signal (i.e. when the difference in voltage level between the input signal and the output signal exceeds the predetermined value). In this way, the slew rate of the amplifier is increased and the time delay between changes in the input signal and changes in the output signal is decreased.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
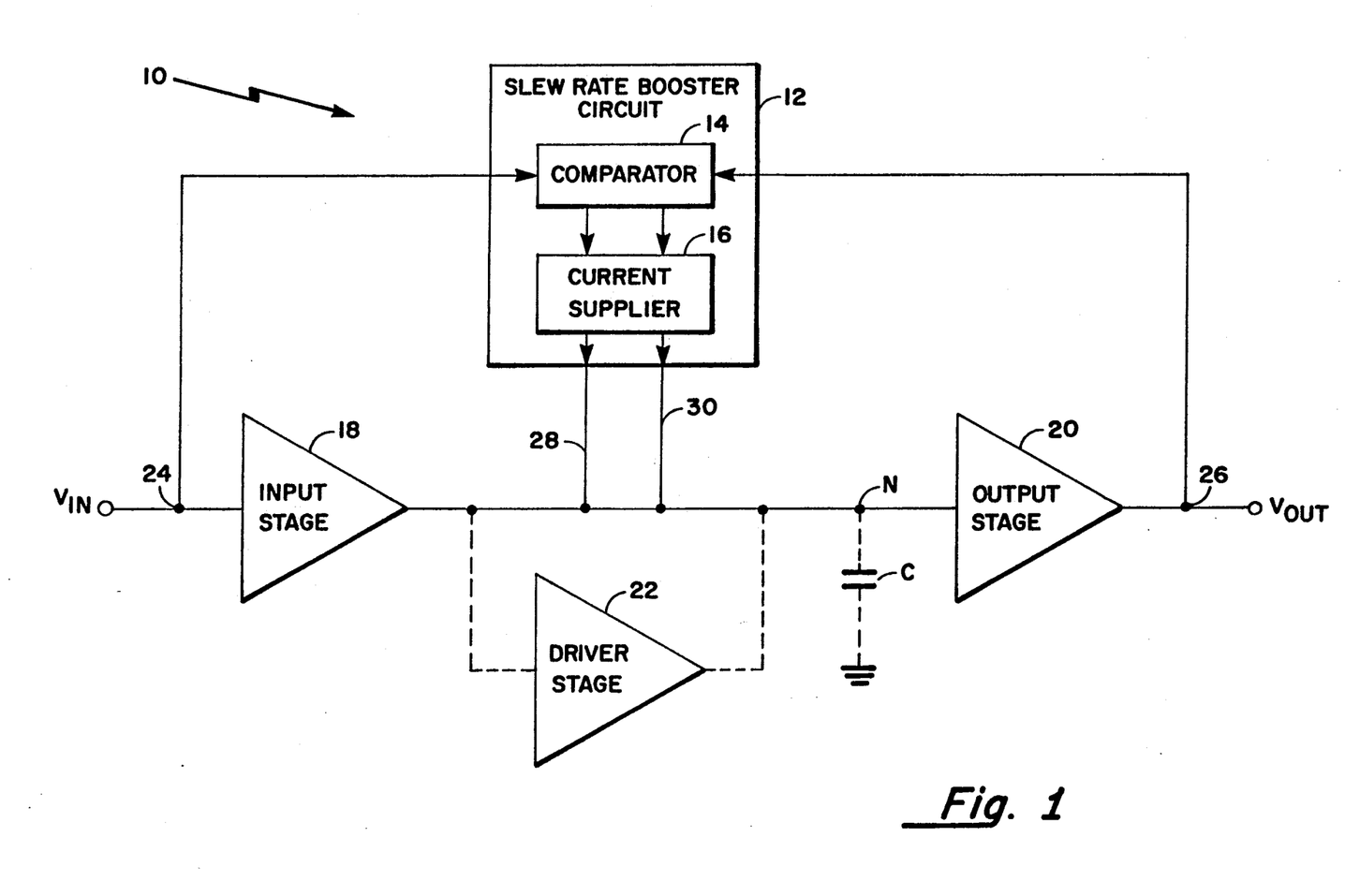
FIG. 1 is a simplified block diagram of an amplifier circuit in accordance with the present invention.

Referring now to FIG. 1, a simplified block diagram of an amplifier 10 is shown to include a slew rate booster, or enhancing circuit 12 in accordance with the invention, as will be described in greater detail in conjunction with FIGS. 4 and 5 below. Suffice it here to say that slew rate booster circuit 12 includes means 14 for comparing an input signal $V_{in}$ of the amplifier 10 to an output signal $V_{out}$ of the amplifier 10 in order to determine the difference in the voltage levels of such signals. Slew rate booster circuit 12 further comprises means 16 for supplying a current to the amplifier 10 in response to the difference in the voltage levels between the input signal $V_{in}$ and the output signal $V_{out}$ being above a predetermined value. Here, such supplied current is provided by two signal lines 28, 30.

As is conventional, amplifier circuit 10 includes an input stage 18 and an output stage 20. Input stage 18 has an input port 24 fed by an input signal $V_{in}$ and is serially coupled to the output stage 20 at a circuit node N, as shown. Output stage 20 provides, at an output port 26 thereof, an output signal $V_{out}$ which may be an amplified replica of the input signal $V_{in}$. Amplifier 10 may be of a variety of types, as are conventional. For example, amplifier 10 may be a buffer amplifier, generally provided with unity gain. In circuit designs, buffer amplifiers are generally used to isolate the preceding stage from the following stage. For this purpose, the ideal buffer amplifier has a high input impedance in order to prevent excessive loading of the preceding stage and a low output impedance in order to provide suitable capability to drive loads having small resistances. As is conventional, amplifier circuit 10 may include a driver stage 22, such as may be coupled to the circuit node N between the input stage 18 and the output stage 20, as shown.

Also coupled to circuit node N is a capacitor C. Capacitor C may be a parasitic capacitance internal to the amplifier circuit 10 or an external capacitor, such as is often added to modify the frequency response of the amplifier 10 in order to prevent oscillations. Regardless of the mechanism providing capacitor C, such capacitance affects the slew rate of the amplifier circuit 10. That is, capacitor C affects how fast the voltage level of the output signal $V_{out}$ changes with time, in response to changes in the voltage level of the input signal $V_{in}$ since the voltage across capacitor C cannot change instantaneously. Specifically, the rate at which the output signal $V_{out}$ changes with time, in response to changes in the input voltage $V_{in}$ is equal to the value of current charging or discharging capacitor C divided by the capacitance of capacitor C. Additionally, such capacitance C affects the delay between changes in the voltage level of the input signal $V_{in}$ and the output signal $V_{out}$.

Figure 2:
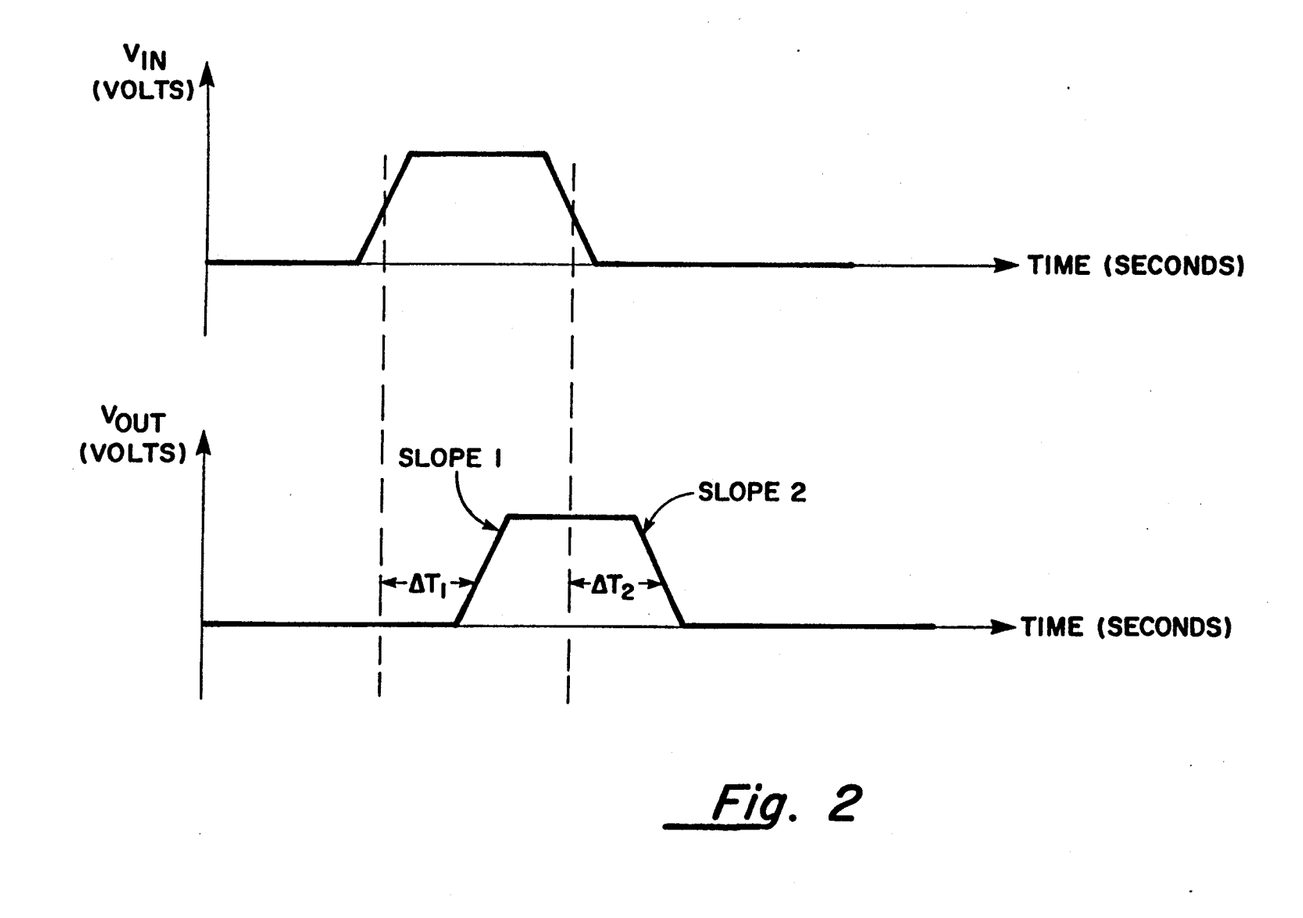
FIG. 2 shows an exemplary input signal $V_{in}$ to an amplifier circuit and an exemplary output signal $V_{out}$ thereof.

Referring now to FIG. 2, exemplary input and output signals $V_{in}$, $V_{out}$, respectively, are shown. The slew rate refers to the slope of the transitions of the output signal $V_{out}$ (labelled slope 1 and slope 2). The current that charges or discharges capacitor C is conventionally provided by the input stage 18 and the driver stage 22, if one is provided. In some instances, for example, when changes in the input signal $V_{in}$ occur relatively slowly, the charging current from the input stage 18 is sufficient to charge or discharge the capacitor C in order to provide a suitable slew rate. However, when the input signal $V_{in}$ changes rapidly, the slew rate may be undesirably slow. Another problem addressed by the slew rate booster circuit 12 is the delay between changes in the input signal $V_{in}$ and changes in the output signal $V_{out}$. Such delay is labelled $\Delta T_1$ and $\Delta T_2$ in FIG. 2.

Here, the slew rate booster circuit 12, and more specifically the current supply 16, increases the slew rate of amplifier 10 by supplying a current, via signal lines 28, 30 to circuit node N in order to charge or discharge the capacitor C. As is apparent from the above discussion, such slew rate enhancing is necessary only in instances when the charging/discharging current provided by the input stage 18 and/or the driver stage 22 is insufficient. It is the purpose of the comparator 14 to determine when the slew rate booster circuit 12 is necessary, as will be discussed in greater detail below in conjunction with FIGS. 3 and 4.

Figure 3:
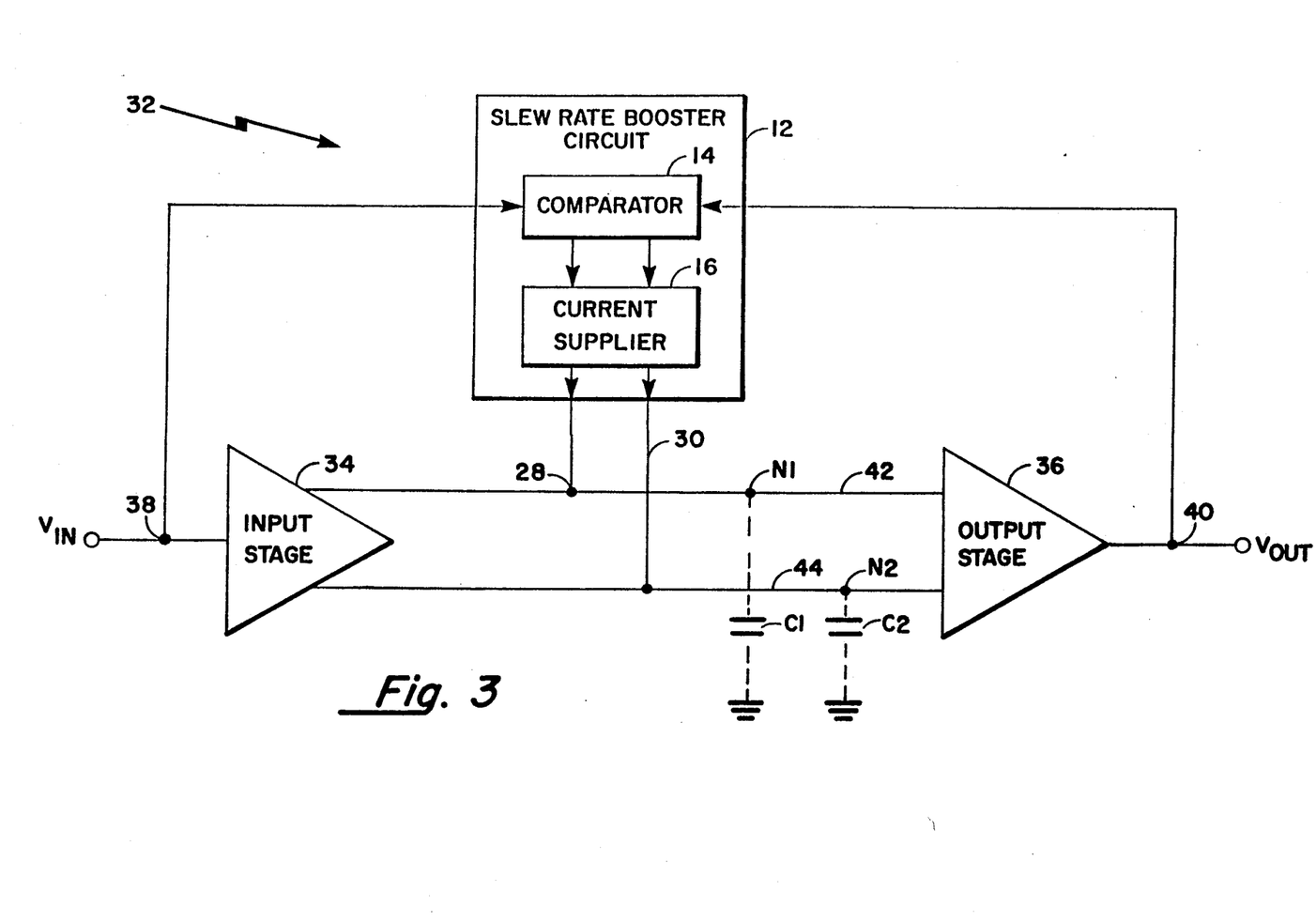
FIG. 3 is a simplified block diagram of an alternate embodiment of an amplifier circuit in accordance with the invention.

Turning now to FIG. 3, an amplifier 32 is shown which is similar to amplifier 10 (FIG. 1) but with slight variations, as will be described. Amplifier 32 includes an input stage 34 and an output stage 36, with the input stage 34 having an input port 38 fed by an input signal $V_{in}$. Output stage 36 has an output port 40 at which is provided an output signal $V_{out}$. Input stage 34 and output stage 36 will be described in greater detail in conjunction with FIG. 4. Suffice it here to say however that the input stage 34 provides an amplified current on signal lines 42, 44. Here again, amplifier 32 includes a slew rate booster circuit 12, identical to circuit 12 in FIG. 1. That is, circuit 12 includes means 14 for comparing the input signal $V_{in}$ of amplifier circuit 32 with the output signal $V_{out}$ thereof to determine the difference in the voltage level of the signals and means 16 for supplying a current to the amplifier circuit 32 in response to the difference in the voltage level between the input signal $V_{in}$ and the output signal $V_{out}$ being above a predetermined value.

Here however, amplifier circuit 32 is of a type having two circuit nodes N1 and N2 which have capacitance C1 and C2, respectively, which affects the slew rate of the circuit 32. More specifically, input stage 34 has a pair of signal lines 42, 44 coupled to output stage 36, as shown, with each one of signal lines 42, 44 having a capacitance C1, C2, respectively, associated therewith. As with the capacitor C of amplifier 10 (FIG. 1), capacitors C1 and C2 may represent parasitic capacitances internal to the amplifier circuit 32 or external capacitors added to modify the frequency response of the amplifier 10 to prevent oscillations, as is conventional. Generally, amplifier 32 is of the type adapted for processing an input signal $V_{in}$ having either positive or negative polarity, as is conventional. That is, when the input signal $V_{in}$ is of a first polarity (relative to zero volts), then a signal is provided to the output port 40 via a first one of the pair of signal lines 42, 44; whereas, when the input signal $V_{in}$ is of a second polarity, a signal is provided to the output port 40 via a second one of the pair of signal lines 42, 44. Since there are capacitances C1, C2 associated with each of the signal lines 42, 44, respectively, it is desirable to couple slew rate booster circuit 12 to both such signal lines 42, 44 as shown in FIG. 3. With this arrangement, when difference between the voltage level of the input signal $V_{in}$ and that the output signal $V_{out}$ is greater than a predetermined value, current is injected or removed (depending on whether the capacitors C1 and C2 require charging or discharging in order to bring the voltage level of the output signal $V_{out}$ in line with the voltage level of the input signal $V_{in}$) into circuit node N1 or N2.

Figure 4:
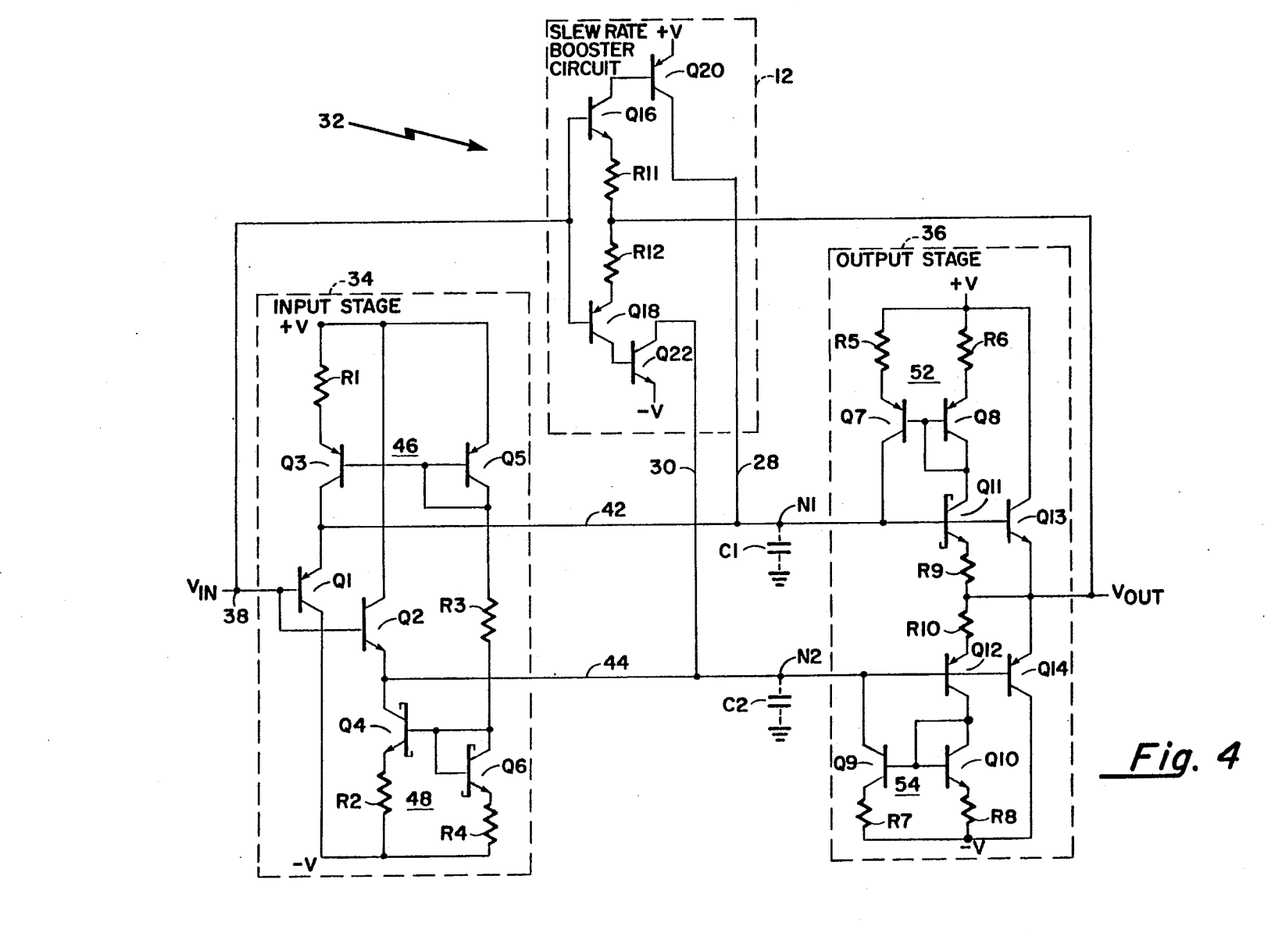
FIG. 4 is a schematic of the amplifier circuit of FIG. 3.

Referring now to FIG. 4, an exemplary amplifier circuit 32 of the type shown in FIG. 2 is shown. Here, amplifier 32 is a buffer amplifier. As mentioned, amplifier 32 includes an input stage 34, an output stage 36, a slew rate booster circuit 12, and a pair of capacitances C1 and C2. The input signal $V_{in}$ is coupled to input port 38 whereas the output signal $V_{out}$ is provided at the output port 40. More specifically, input signal $V_{in}$ is coupled to the base of each of a pair of transistors Q1 and Q2 of input stage 34, with Q1 being a PNP transistor and Q2 being an NPN transistor. The input current path for a first current mirror 46 is provided through a transistor Q5, here such transistor Q5 being connected to operate as a diode. The output current path for current mirror 46 is provided through transistor Q3. Transistor Q4 provides the output current path for a second current mirror 48. The input current path for the second current mirror 48 is provided through a transistor Q6, such transistor Q6 being connected to operate as a diode. With this arrangement, and as is conventional, the signal lines 42, 44 carry currents amplified in accordance with the gain of the corresponding one of transistors Q1, Q2, respectively. As is conventional, resistors R3 and R4 establish the desired currents to be mirrored in current mirrors 46, 48 and resistors R1 and R2 limit the emitter current of transistors Q3 and Q4, respectively.

The currents so provided by input stage 34 on signal lines 42, 44 charge or discharge capacitances C1 and C2 accordingly. Ideally however, such currents are provided to the output stage 36 so that the output signal $V_{out}$ will change voltage level in accordance with changes in the input signal $V_{in}$ with minimal delay. Thus, if capacitances C1 and C2 are so charged or discharged by the above-mentioned input stage 34 provided currents, a delay is caused between changes in the input signal $V_{in}$ and in the output signal $V_{out}$. Such currents provided on signal lines 42, 44 ideally drive the output stage 36 and when diverted to capacitors C1, C2, additionally, the slew rate of the amplifier 32 suffers. Thus, the purpose of slew rate booster circuit 12 now becomes apparent. Such circuit 12 injects (i.e. sources) or removes (i.e. sinks) current at circuit nodes N1 and N2 in order to charge or discharge capacitances C1 and C2, respectively, as is necessary for the output voltage $V_{out}$ change at a suitably fast slew rate and with minimal delay after changes in the input voltage $V_{in}$, as will be described in greater detail below.

Considering now the output stage 36 in greater detail, a third current mirror 52 is comprised of transistors Q7 and Q8 and a fourth current mirror 54 is comprised of transistors Q9 and Q10, as shown. More specifically, the input current path of current mirror 52 is provided through diode connected transistor Q8 and the output current path thereof is provided through transistor Q7. For current mirror 54, the input current path is provided through diode connected transistor Q10 and the output current path thereof is provided through transistor Q9. Resistors R5–R8 establish the desired mirrored currents, as is conventional. In operation, and depending again on which of signal lines 42, 44 carries the amplified current, either a transistor Q11 or a transistor Q12 will be conducting. That is, if the input signal $V_{in}$ is positive relative to $V_{out}$, then transistor Q11 is on whereas when the input signal $V_{in}$ is negative relative to $V_{out}$, then transistor Q12 is on. Transistors Q11 and Q12, as well as transistors Q13 and Q14, are coupled to provide a push-pull emitter follower arrangement, as is conventional in an amplifier output stage 36. Resistors R9 and R10 limit the emitter currents of transistors Q11 and Q12, as is conventional.

It is noted that in amplifier circuits having an optional driver stage 22 (FIG. 1) the driver stage increases the current supplied to or removed from the capacitance C as is conventional. Typically, the driver stage 22 comprises a class A type amplifier. It is further noted that such a conventional driver stage 22 is feasible and conventional for use with amplifier 32 (FIGS. 3 and 4).

Turning now to the slew rate booster circuit 12, it is noted that such circuit 12 is fed by the input signal $V_{in}$ and the output signal $V_{out}$, as mentioned above. More specifically, the input signal $V_{in}$ is fed to the base electrodes of a pair of transistors Q16 and Q18. The output signal $V_{out}$ is fed to first terminals of a pair of series coupled resistors R11 and R12, as shown. The second terminals of resistors R11 and R12 are coupled to the emitter electrodes of transistors Q16 and Q18, respectively. NPN transistor Q16 is further coupled to a PNP transistor Q20, whereas PNP transistor Q18 is further coupled to an NPN transistor Q22. Specifically, the collector electrode of transistor Q16 is coupled to the base electrode of transistor Q20 and the collector electrode of transistor Q18 is coupled to the base electrode of transistor Q22. The emitter electrodes of transistors Q20 and Q22 are coupled to the positive and negative supply voltages V+ and V−, respectively, and the collector electrodes of transistors Q20 and Q22 provide currents to charge or discharge the capacitors C1 and C2 via signal lines 28, 30, respectively, as shown.

In considering the operation of slew rate booster circuit 12, it is first noted that when the input signal $V_{in}$ changes relatively slowly, the input stage 34 in conjunction with the optional driver stage supplies sufficient current to charge or discharge the capacitances C1 and C2 so that the output signal $V_{out}$ follows the input signal $V_{in}$ closely. That is, under such conditions, the delay ($\Delta T_1$ and $\Delta T_2$, FIG. 2) between the input signal $V_{in}$ and the output signal $V_{out}$ relatively small and the slew rate itself (slope 1 and slope 2, FIG. 2) is suitably large. Thus, under such conditions, the slew rate booster circuit 12 is unnecessary and is turned off. However, when such input stage 34 (and any driver stage) currents are not sufficient to charge or discharge the capacitances C1 and C2 quickly enough so that the delay between changes in the input signal $V_{in}$ and output $V_{out}$ is minimal and the slew rate suitable, then the slew rate booster circuit 12 is turned on and currents are injected or removed at circuit nodes N1, N2.

First, the way in which the slew rate booster circuit 12 is turned on and off will be described. The means for comparing the input signal $V_{in}$ of the amplifier circuit 32 and the output signal $V_{out}$ of the amplifier circuit 32 to determine whether the difference in the voltage level of such signals is greater than a predetermined value is comprised of transistors Q16, Q18 and resistors R11, R12. Here, the predetermined value is the base to emitter voltage drop of transistors Q16, Q18. That is, if the difference between the voltage levels of the input signal $V_{in}$ and output signal $V_{out}$ is greater than the $V_{be}$ of transistors Q16 or Q18, then the slew rate booster circuit 12 is turned on. More specifically, the one of the transistors Q16 and Q18 whose $V_{be}$ drop is exceeded begins to conduct. Since transistor Q16 is an NPN and transistor Q18 is a PNP, only one of such transistors will be on at a given time. That is, if the output signal $V_{out}$ is positive with respect to the input signal $V_{in}$ then the $V_{be}$ of PNP transistor Q18 may be exceeded (depending on the actual voltage level difference between such signals); whereas, if the output signal $V_{out}$ is negative with respect to the input signal $V_{in}$, then the $V_{be}$ of NPN transistor Q16 may be exceeded. In this way, the slew rate booster circuit 12 is turned on (i.e. one of transistors Q16, Q18 conducts) when the difference between the voltage levels of the input signal $V_{in}$ and the output signal $V_{out}$ exceeds the $V_{be}$ of transistors Q16, Q18.

The means 16 (FIG. 3) for supplying a current to the amplifier circuit 32 comprises transistors Q20 and Q22. When transistor Q16 is on, so too is transistor Q20. Likewise, when transistor Q18 is on, so too is transistor Q22. Consider, for purposes of discussing the operation of amplifier 32, the case when the amplified current is provided by the input stage 34 to the output stage 36 on signal line 42 and the output signal $V_{out}$ is more than one $V_{be}$ drop less than the input voltage $V_{in}$. In conventional amplifiers, the current provided by input stage 34 on signal line 42 will charge capacitor C1 slowly, thereby causing a delay in the output signal $V_{out}$ following or tracking the input signal $V_{in}$ and a limited rate of change in the output signal $V_{out}$ (i.e. slew rate). In the present circuit 33 however, the $V_{be}$ of transistor Q16 is exceeded, turning on both transistors Q16 and Q20. It is apparent, since the output signal $V_{out}$ is less than the input signal $V_{in}$, that the quicker capacitor C1 is charged, the quicker the current provided by input stage 34 reaches output stage 36 and raises the output signal voltage level accordingly. That is, the quicker capacitor C1 is charged, the greater the slew rate of amplifier 32. With transistor Q20 thus turned on, current is supplied to capacitor C1 from the positive supply voltage V+ and through transistor Q20. Such current continues to be supplied through transistor Q20 to capacitor C1 until the voltage level difference between the input signal $V_{in}$ and the output signal $V_{out}$ falls below the $V_{be}$ drop of transistor Q16. That is, the slew rate booster circuit 12 is turned off once the difference in the voltage level between the input signal $V_{in}$ and output signal $V_{out}$ falls below the $V_{be}$ drop of transistors Q16, Q18.

When capacitor C1 requires discharging, in order to decrease the input to output signal delay and increase the slew rate of amplifier 32, the input stage 34 provides such function. For example, consider the case where the amplified current is still provided by input stage 34 to the output stage 36 via signal line 42 but the output signal $V_{out}$ is greater than the input voltage $V_{in}$. In this situation, capacitor C1 requires discharging to decrease the input to output signal delay and to boost or increase the slew rate. Stated differently, capacitor C1 must be discharged in order for the output voltage $V_{out}$ to fall and thus, to track the input voltage $V_{in}$. Specifically, it is transistor Q1 of input stage 34 through which such capacitor C1 is discharged.

From the above discussion of amplifier 32 when the amplified current is carried by signal line 42, the operation of slew rate booster circuit 12 when such current is provided on signal line 44 should now be apparent. In this case, when the output signal $V_{out}$ is more than one $V_{be}$ drop greater than the input signal $V_{in}$, transistors Q18 and Q22 are on and capacitor C2 is discharged through transistor Q22. When capacitor C2 requires charging on the other hand, in order to decrease the input to output signal delay and increase the slew rate of amplifier 32, the input stage 34 provides such function. That is, when the amplified current is provided by input stage 34 to the output stage 36 via signal line 44 and the output signal $V_{out}$ is less than the input signal $V_{in}$, capacitor C2 requires charging to in order for the output signal $V_{out}$ to rise and track the input signal $V_{in}$. It is transistor Q2 of input stage 34 through which such capacitor C2 is charged.

It should now be apparent that in amplifier 10 (FIG. 1), in which the collector electrodes of transistors Q20 and Q22 are coupled to the sa=circuit node N, transistor Q20 sources current and transistor Q22 sinks current. Stated differently, transistor Q20 injects current into such circuit node N (i.e. in order to charge capacitor C) whereas transistor Q22 removes current from such node N (i.e. in order to discharge capacitor C). In the case of amplifiers 32 (i.e. an amplifier having two circuit nodes N1, N2 with capacitances C1, C2 associated therewith), transistor Q20 sources current to charge capacitor C1 whereas transistor Q22 sinks current to discharge capacitor C2. Moreover, in operating conditions in which it is desirable to discharge capacitor C1 or to charge capacitor C2, such function is provided by the input stage and specifically by transistors Q1 and Q2, respectively, as noted above.

It is noted that resistors R11 and R12 serve to limit the emitter currents of transistors Q16 and Q18, respectively. In this way, the possibility of capacitors C1 and C2 being overcharged is prevented. Thus, overshoot on the output signal $V_{out}$ is also prevented.

As noted above in conjunction with FIG. 2, capacitance (for example capacitances C1, C2 of amplifier 32, FIG. 4) affects the delay between changes in the input signal $V_{in}$ and changes in the output signal $V_{out}$ as well as affecting the rate of change of the output signal $V_{out}$ with time (i.e. slew rate). Moreover, the capacitance affecting signal delay and slew rate are those described above (i.e. C1 and C2 of amplifier 32) as well as the capacitance associated with a load to the amplifier (i.e. a capacitance coupled to the output port 40 of amplifier 32). Slew rate booster circuit 12 enhances the slew rate as affected by internal capacitances C1 and C2 as described above in conjunction with FIG. 4. Conventional circuits addressed this problem by increasing the current supplying capacity of the input stage in order to deliver or remove the required current from internal capacitances C1 and C2. However, this solution is not desirable since the increase current capacity of the input stage resulted in increased power dissipation. The slew rate booster circuit 12 does not affect the power dissipation significantly since the circuit 12 is turned off when not necessary (i.e. when there is less than a $V_{be}$ drop of voltage difference between the input signal $V_{in}$ and the output signal $V_{out}$. As to decreasing the effect of the load capacitance on the input signal to output signal delay and the slew rate, current mirrors 52 and 54 assist in this effort. That is, the current mirrors 52 and 54 essentially sense the output voltage $V_{out}$ and adjust the base current of transistors Q11 and Q12 in accordance therewith.

Figure 5:
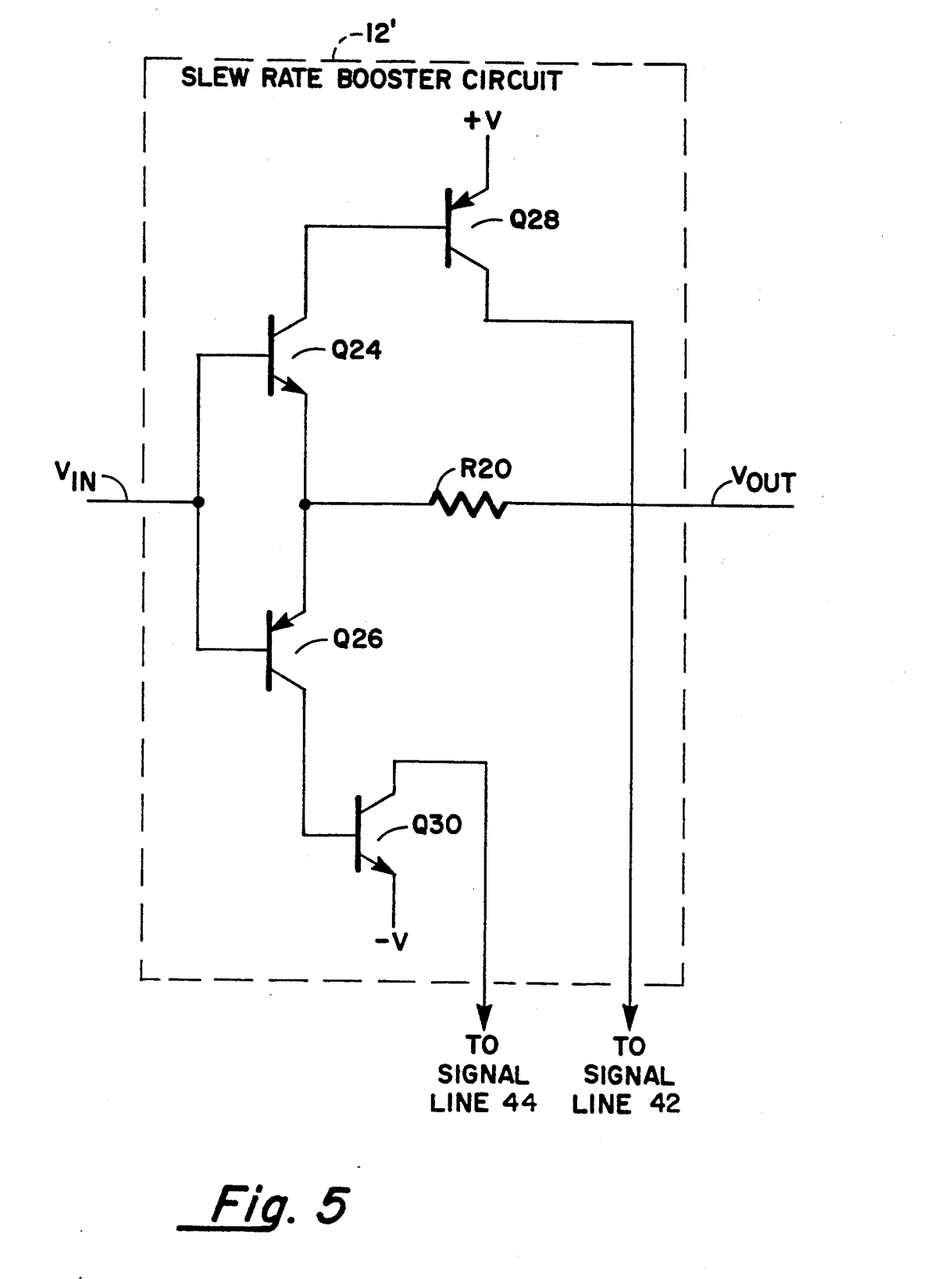
FIG. 5 is an alternate embodiment of the slew rate increasing circuit shown in FIG. 3.

Referring now to FIG. 5, an alternate embodiment of the slew rate booster circuit 12 of FIG. 4, slew rate booster circuit 12' is here shown to include transistors Q24–Q30. Transistors Q24 and Q26 are like transistors Q16 and Q18 (FIG. 4), respectively, and transistors Q28 and Q30 are like transistors Q20 and Q22 (FIG. 4), respectively. The difference between slew rate booster circuits 12 and 12' is that if the current limiting resistors R11 and R12 of circuit 12 are of equal value, such resistors R11 and R12 may be replaced by the equivalent resistor R20 (FIG. 5) and the circuit 12' simplified in this way. That is, the resistor R20 limits the emitter current of transistors Q24 and Q26 by limiting the voltage at such emitter electrodes. This limiting action, (i.e. limiting the conduction of transistors Q24 and Q26), in turn limits the conduction of transistors Q28 and Q30, respectively.

Having described preferred embodiments of the invention, it will now become apparent to one of skill in the art that other embodiments incorporating their concepts may be used. For example, it should be apparent that the slew rate booster circuits 12 or 12' can be used in conjunction with any linear amplifier circuits an others that are susceptible to delay between changes in the input and output signals as well as slew rate limitations as a result of parasitic or other capacitance. Moreover, it is noted that the components of slew rate booster circuit 12 may be provided by components conventionally found in amplifier circuits. That is, in some cases, the functionality of the components of circuit 12 may be combined with like components suitable for providing the above-described slew rate enhancing. It is felt, therefore, that these embodiments should not be limited to disclosed embodiments, but rather should be limited only by the spirit and scope of the appended claims.

What is claimed is:

1. A circuit for increasing the slew rate on an amplifier circuit comprising:
   means for comparing an input signal of said amplifier circuit and an output signal of said amplifier circuit and selectively providing a control signal when the difference in the voltage levels of said signals exceeds a predetermined threshold; and means for supplying a current into the amplifier circuit in response to said control signal wherein, when said difference in levels of said signals is less than said threshold, said supply means is off and does not provide current to said amplifier and, when the difference in the voltage levels of said signals exceeds said predetermined threshold, said supplying means is activated and supplies current to said amplifier in accordance with said control signal to increase the slew rate of said amplifier.

2. A circuit for increasing the slew rate of an amplifier circuit comprising:

means for comparing an input signal of said amplifier circuit and an output signal of said amplifier circuit to determine the difference in the voltage levels of said signals wherein said comparing means comprises a first pair of transistors having interconnected base electrodes coupled to said input signal;

means for supplying a current into the amplifier circuit in response to the difference in the voltage level between the input signal and the output signal being above a predetermined value; and wherein a first one of the first pair of transistor is an NPN transistor and a second one of the first pair of transistors in a PNP transistor, wherein the emitter of the NPN transistor is coupled to the emitter of the PNP transistor through a resistor and wherein the output voltage of the amplifier is coupled to said resistor.

3. The circuit recited in claim 2 wherein said predetermined value is equal to the base to emitter voltage of said NPN transistor.

4. The circuit recited in claim 2 wherein the supplying means comprises a second pair of transistors, with a first one of said second pair of transistors being coupled to the first one of the first pair of transistors and a second one of said second pair of transistors being coupled to the second one of the first pair of transistors.

5. The circuit recited in claim 4 wherein the first one of the second pair of transistor is a PNP transistor and the second one of the second pair of transistors is an NPN transistor.

6. The circuit recited in claim 5 wherein the base electrode of the first one of the second pair of transistors is coupled to the collector electrode of the first one of the first pair of transistors and wherein the base electrode of the second one of the second pair of transistors is coupled to the collector electrode of the second one of the first pair of transistors.

7. The circuit recited in claim 6 wherein the injected current is provided at the collector electrodes of the second pair of transistors.

8. An amplifier circuit comprising:

an input stage having a input port fed by an input signal;

an output stage serially coupled to said input stage at a circuit node and having an output port, wherein an output signal is provided at said output port with said output signal being proportional to said input signal;

a slew rate increasing circuit coupled between said input port and said output port, said slew rate increasing circuit providing a current to said circuit node when the voltage difference between said input signal and said output signal is greater than a predetermined value, said slew rate increasing circuit comprising means for comparing said input signal to said output signal to determine the difference in the voltage level of said signals and means for providing a current proportional to the difference in the voltage between the input signal and the output signal and for coupling said current to said circuit node; and wherein said comparing means comprises a first pair transistors having interconnected base electrodes coupled to said input signal, wherein a first one of said first pair of transistors is an NPN transistor and a second one of said first pair of transistors is a PNP transistor, wherein the emitter of the NPN transistor is coupled to the emitter of the PNP transistor through a resistor and wherein the output voltage of the amplifier is coupled to said resistor.

9. The amplifier circuit recited in claim 8 wherein the current providing means comprises a second pair of transistors, with a first one of said second pair of transistors being coupled to the first one of the first pair of transistors and a second one of said second pair of transistors being coupled to the second one of the first pair of transistors, wherein said current is provided at collector electrodes of each of said second pair of transistors.

* * * * *